(12) United States Patent
Yang et al.

(10) Patent No.: US 8,203,118 B2
(45) Date of Patent: Jun. 19, 2012

(54) ION-TRAP MASS SPECTROMETER DRIVEN BY A MONOLITHIC PHOTODIODE ARRAY

(75) Inventors: Wei Yang, Minnetonka, MN (US); Alex Gu, Plymouth, MN (US)

(73) Assignee: Honeywell International, Inc., Morristown, NJ (US)

( * ) Notice: Subject to any disclaimer, the term of this patent is extended or adjusted under 35 U.S.C. 154(b) by 202 days.

(21) Appl. No.: 12/816,875

(22) Filed: Jun. 16, 2010

(65) Prior Publication Data

US 2011/0139974 A1 Jun. 16, 2011

Related U.S. Application Data

(60) Provisional application No. 61/285,540, filed on Dec. 11, 2009.

(51) Int. Cl.
  *G01N 33/00* (2006.01)
  *G01N 33/48* (2006.01)
  *G08B 5/00* (2006.01)
  *G01B 9/00* (2006.01)

(52) U.S. Cl. ........ 250/288; 250/281; 250/282; 250/284; 250/290; 250/291; 340/505; 340/521; 340/540; 340/632; 340/815.4

(58) Field of Classification Search ............... 250/281, 250/282, 284, 288, 290, 291; 340/505, 521, 340/540, 632, 690, 815.4
See application file for complete search history.

(56) References Cited

U.S. PATENT DOCUMENTS

| | | | |
|---|---|---|---|
| 5,291,017 A | 3/1994 | Wang et al. | 250/292 |
| 5,401,963 A * | 3/1995 | Sittler | 250/288 |
| 5,420,425 A | 5/1995 | Bier et al. | 250/292 |
| 5,429,685 A * | 7/1995 | Saito et al. | 136/255 |
| 5,541,408 A * | 7/1996 | Sittler | 250/288 |
| 5,989,451 A * | 11/1999 | Lemieux et al. | 252/299.1 |
| 6,153,895 A * | 11/2000 | Watanabe et al. | 257/101 |
| 6,200,531 B1 * | 3/2001 | Liljestrand et al. | 422/52 |
| 6,249,346 B1 | 6/2001 | Chen et al. | 356/328 |
| 6,517,777 B2 * | 2/2003 | Liljestrand et al. | 422/52 |
| 6,590,207 B2 * | 7/2003 | Berger et al. | 250/296 |
| 6,608,679 B1 | 8/2003 | Chen et al. | 356/328 |
| 6,627,882 B2 * | 9/2003 | Schultz et al. | 250/288 |
| 6,630,128 B1 * | 10/2003 | Love et al. | 424/9.362 |
| 6,633,031 B1 * | 10/2003 | Schultz et al. | 250/288 |
| 6,663,781 B1 * | 12/2003 | Huling et al. | 210/668 |
| 6,765,232 B2 * | 7/2004 | Takahashi et al. | 257/79 |
| 6,822,231 B2 * | 11/2004 | Schultz et al. | 250/288 |
| 6,831,276 B2 * | 12/2004 | Berger et al. | 250/296 |
| 6,861,644 B2 | 3/2005 | Miseki | 250/282 |
| 6,958,474 B2 * | 10/2005 | Laprade et al. | 250/287 |

(Continued)

*Primary Examiner* — David A Vanore
(74) *Attorney, Agent, or Firm* — Kermit D. Lopez; Luis M. Ortiz; Ortiz & Lopez, PLLC

(57) ABSTRACT

A chip-scale ion-trap mass spectrometer driven by a monolithic photodiode array and a method of fabricating the same. A high-voltage photovoltaic source is located in proximity to the ion-trap mass spectrometer structure. The high-voltage photovoltaic source includes monolithically fabricated and serially connected photodiodes. An external light source illuminates the photodiodes to generate a high voltage across the photodiode array. An RF voltage modulation is attained by modulating the light source at a desired RF frequency. The high-voltage photodiode array may be monolithically fabricated in association with the ion-trap mass spectrometer. The photodiode array requires a small area compared to the ion-trap mass spectrometer size as the spectrometer typically possess a very small capacitance and a low power consumption.

27 Claims, 4 Drawing Sheets

U.S. PATENT DOCUMENTS

| | | |
|---|---|---|
| 7,067,846 B2 * | 6/2006 | Takahashi et al. ............. 257/79 |
| 7,112,787 B2 | 9/2006 | Mordehal .................... 250/292 |
| 7,151,447 B1 * | 12/2006 | Willms et al. ................ 340/540 |
| 7,180,100 B2 | 2/2007 | Takahashi et al. ............ 257/101 |
| 7,208,726 B2 | 4/2007 | Hidalgo et al. ............... 250/281 |
| 7,253,293 B2 * | 8/2007 | Slominski et al. ............ 552/653 |
| 7,335,246 B2 * | 2/2008 | Huling et al. .................. 95/141 |
| 7,390,689 B2 * | 6/2008 | Mazur et al. ................... 438/71 |
| 7,402,799 B2 * | 7/2008 | Freidhoff ..................... 250/294 |
| 7,449,686 B2 | 11/2008 | Wang et al. ................... 250/292 |
| 7,453,096 B2 * | 11/2008 | Takahashi et al. ............. 257/87 |
| 7,502,109 B2 * | 3/2009 | Bonne et al. .................. 356/328 |
| 7,518,161 B2 * | 4/2009 | Takahashi et al. ............ 257/101 |
| 7,630,063 B2 * | 12/2009 | Padmanabhan et al. ......... 356/39 |
| 7,766,033 B2 * | 8/2010 | Mathies et al. ................ 137/297 |
| 7,800,193 B2 * | 9/2010 | Fujikata et al. ................ 257/449 |
| 7,863,518 B2 * | 1/2011 | Terakawa et al. ............. 136/255 |
| 7,881,869 B2 * | 2/2011 | Clayton et al. .................. 702/18 |
| 7,911,617 B2 * | 3/2011 | Padmanabhan et al. ...... 356/450 |
| 7,968,362 B2 * | 6/2011 | Takahashi et al. ............. 438/47 |
| 2008/0142706 A1 | 6/2008 | Michelmann ................ 250/292 |
| 2008/0277580 A1 | 11/2008 | Takeshita et al. ............. 250/292 |
| 2009/0020694 A1 | 1/2009 | Flory ............................ 250/282 |
| 2009/0179148 A1 | 7/2009 | Yasuda et al. ................ 250/282 |
| 2009/0179150 A1 | 7/2009 | Kovtoun et al. .............. 250/283 |
| 2009/0206247 A1 | 8/2009 | Holle ............................ 250/282 |

* cited by examiner

ION-TRAP MASS SPECTROMETER DRIVEN BY A MONOLITHIC PHOTODIODE ARRAY

CROSS-REFERENCE TO PROVISIONAL APPLICATION

This application claims priority to U.S. Provisional Patent Application No. 61/285,540, filed on Dec. 11, 2009 entitled "Ion-Trap Mass Spectrometer Driven by a Monolithic Photodiode Array," and which is hereby incorporated by reference in its entirety.

TECHNICAL FIELD

Embodiments are generally related to spectrometers. Embodiments are additionally related to ion-trap mass spectrometers. Embodiments are also related to monolithic photodiodes and chip-scale electronic components.

BACKGROUND OF THE INVENTION

A sensitive and versatile analytical system, capable of identifying both large and small molecules and determining their molecular structure, is required to address the complex mixtures of molecules found in many types of chemical and biological problems. Mass spectrometry is a technique of obtaining information regarding the mass of specimen molecules by ionizing the molecules into charged particles for identifying the species of the molecule. In high performance mass spectrometry, it is desired to obtain the best possible accuracy in determining the composition of the sample or molecule that is being measured.

An ITMS (Ion Trap Mass Spectrometer) is a potentially powerful tool for the analysis of biopolymers. An ITSM utilizes electrostatic fields to trap ions in a small volume. Advantages of an ITSM include its compact size and its ability to trap and accumulate ions to increase the signal-to-noise ratio and sensitivity of a measurement. The performance of the ITSM is generally dependent on radio frequency (RF) voltage and frequency.

Miniature mass spectrometers utilized in non-laboratory and harsh environments are of interest for continuous on-line and other monitoring tasks. For miniaturized ion traps, such as chip-scale ion trap arrays fabricated on a silicon wafer, the required RF frequency may be 100 MHz to 1000 MHz, while the voltage amplitude may be maintained at several hundred volts. The large voltage swing at a high frequency presents a difficulty in coupling and transmitting the RF power to distributed ion traps on the chip due to large parasitic losses. Additionally, the drive frequency of the ion trap must be increased to detect the low mass ions and maintain resolution as the ion trap dimensions are decreased. Therefore, the trapping of ions in a micro scale trap is difficult. Furthermore, it can be nearly impossible to construct large arrays of a small ITMS in a chip-scale size for mass trapping of ions.

Based on the foregoing, it is believed that a need exists for an improved chip-scale ion-trap mass spectrometer. A need also exists for an improved RF source in proximity with the ITMS, which can be a monolithic photodiode array as described in greater detail herein.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for a micro-scale mass spectrometer capable of mass spectroscopy at high operating pressures.

It is another aspect of the disclosed embodiments to provide for an improved ITMS.

It is a further aspect of the disclosed embodiments to provide for a novel monolithic photodiode array located in proximity with an ITMS and capable of generating high voltage at radio frequency It is yet another aspect of the disclosed embodiments to provide a method for monolithically fabricating a photodiode array in association with an ITMS.

The aforementioned aspects and other objectives and advantages can now be achieved as described herein. A micro-scale spectrometer (e.g., ITMS) is disclosed, which is driven by a monolithic photodiode array. A method of fabricating such a spectrometer is also disclosed. In general, a high-voltage photovoltaic source can be located in proximity with the spectrometer structure. The high-voltage photovoltaic source is generally configured to include a large number of monolithically fabricated and serially connected photodiodes. An external light source (e.g., light emitting diode, laser diode, etc) can be utilized to illuminate the photodiodes in order to generate a high voltage across the photodiode array. An RF voltage modulation may be attained by modulating the light source at a desired RF frequency. The high-voltage photodiode array can be monolithically fabricated in association with the spectrometer. The photodiode array requires a small area compared to the ion-trap mass spectrometer size as the spectrometer typically possess a very small capacitance and low power consumption.

The spectrometer may be configured to include a cylindrical ring electrode and two planar end cap electrodes. Ions can be trapped in a trapping volume defined by the cylindrical ring electrode and the end cap electrodes. The spectrometer can be energized by the high-voltage photovoltaic source that provides the RF voltage between the two end cap electrodes and a RF drive voltage between the ring electrode and the end cap electrodes for trapping of the ions.

The fabrication of the spectrometer in association with the photodiode array includes the formation of a p-n junction on a substrate (e.g. SOD utilizing an implant, a diffusion, or an epitaxial approach. The p-n junction may be etched in order to form individual photodiodes. An insulation layer can be formed in order to electrically insulate the sidewalls from the electrical interconnects. The ion traps structures are interconnected in order to form, for example, an ITMS array. Further, the photodiode may be monolithically fabricated and serially connected in order to form the photodiode array. The photodiode array can in turn be fabricated with an individual spectrometer structure. The photodiode array permits, for example, a high voltage swing at 10-1000 MHz and the resulting high output impedance closely matches the ion trap. Such an approach can be utilized to fabricate a miniature or a micro scale spectrometer (e.g., ITMS) structure as an individual and/or an array device, which can be utilized for applications such as, for example, mobile gas detection, chemical and biological analysis, and so forth.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the disclosed embodiments.

FIG. 1 illustrates a perspective view of a mass spectrometer (e.g., ITMS) driven by a monolithic photodiode array, in accordance with the disclosed embodiments.

DETAILED DESCRIPTION

The particular values and configurations discussed in these non-limiting examples can be varied and are cited merely to illustrate at least one embodiment and are not intended to limit the scope thereof.

Figure 1:
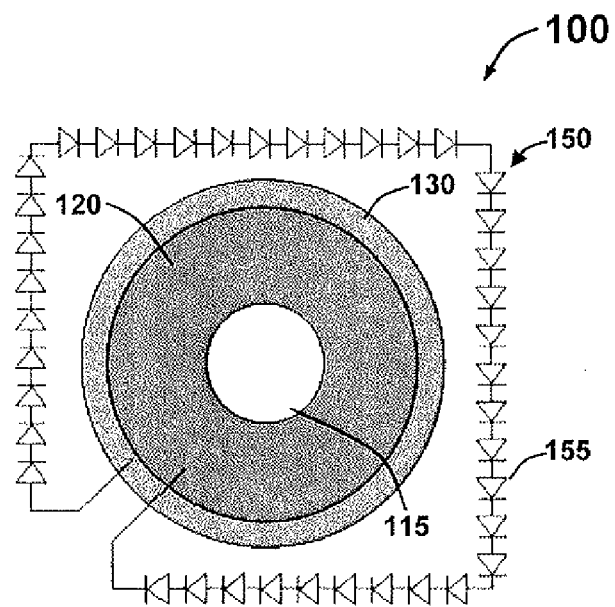

FIG. 1 illustrates a perspective view of a mass spectrometer 100 driven by a monolithic photodiode array 150, in accordance with the disclosed embodiments. It can be appreciated that in some embodiments, the mass spectrometer 100 may be an ITSM (Ion Trap Mass Spectrometer). The mass spectrometer 100 disclosed herein can be utilized with various well-known methods of mass analysis. The mass spectrometer 100 associated with the monolithic photodiode array 150 can be utilized to separate ions according to its mass-to charge ratios. The mass spectrometer 100 can be utilized for the chemical analysis of known and unknown compounds due to its ability to effectively analyze large as well as small molecules.

The mass spectrometer 100 generally includes a cylindrical ring electrode 130 and two planar end cap electrodes 120 and 125. The ions can be trapped in a trapping volume 115 defined by the cylindrical ring electrode 130 and the end cap electrodes 120 and 125. The ring electrode 130 and the endplate electrodes 120 and 125 on either sides of the ring electrode 130 can be bonded in such as way that these electrodes 120, 125 and 130 can be electrically insulated from each other. The mass spectrometer 100 can be energized by a photovoltaic source 180 that provides an RF voltage between the two end cap electrodes 120 and 125 and a RF drive voltage between the ring electrode 130 and the end cap electrodes 120 and 125 for trapping of the ions. Such an on-site RF generation eliminates transmission loss.

The photodiode array 150 comprises a large number of monolithically fabricated and serially connected photodiodes such as a photodiode 155. In general, the photodiode array is a linear array of discrete photodiodes capable of converting light into either current or voltage, depending upon the mode of operation. When a photon of sufficient energy strikes the photodiode 150, it excites an electron, thereby creating a mobile electron and a positively charged electron hole. The photodiode 155 produces an electrical signal in a known manner as a result of light being incident thereon which is produced by, for example, a light source 110. The electrical signal generated by the photodiode array 150 can be supplied to the mass spectrometer 100.

Figure 2:
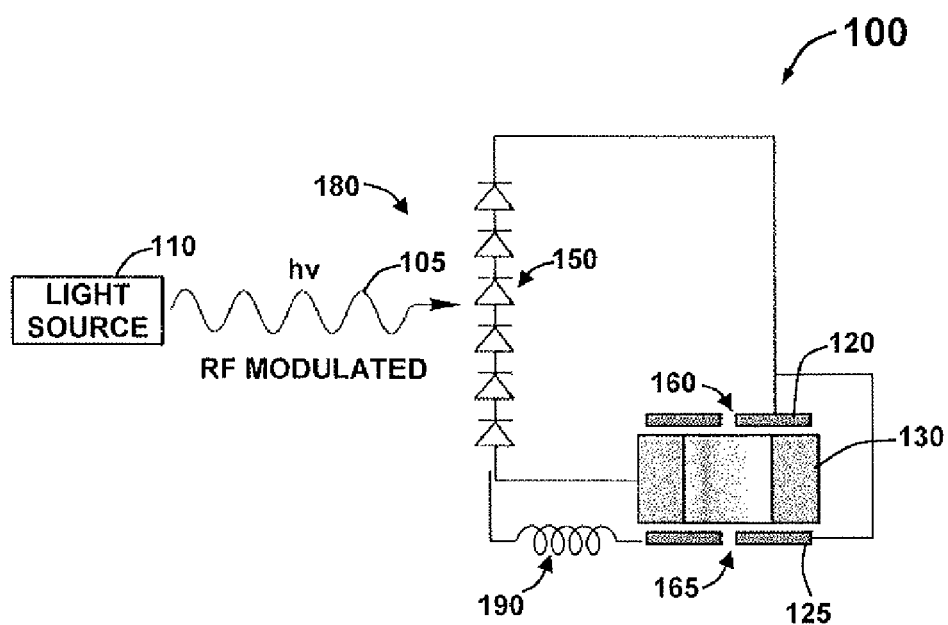
FIG. 2 illustrates a schematic view of the mass spectrometer of FIG. 1 associated with a high-voltage photovoltaic source, in accordance with the disclosed embodiments.

FIG. 2 illustrates a schematic view of the mass spectrometer 100 that communicates electrically with the high-voltage photovoltaic source 180, in accordance with the disclosed embodiments. Note that in FIGS. 1-8, identical or similar parts are generally indicated by identical reference numerals. The photovoltaic source 180 can be located in proximity with the mass spectrometer 100. The light source 110 can be utilized to illuminate the photodiode array 150 in order to generate a high voltage across the photodiode array 150. The light source can be, for example, a light emitting diode (LED) or a laser diode (LD). For example, each photodiode may possess an open circuit voltage of approximately 0.7 V; thus 1000 such diodes serially connected may generate an open circuit voltage of 700 V. The RF modulated light 105 generated by the external light source 110 can be utilized to generate the high voltage across the photodiode array 150.

The high voltage can be transmitted via the electrodes 120, 125 and 130 to the ion trapping volume 115. Apertures 160 and 165 can be provided in association with the electrodes 120 and 125 for injection of a neutral or ionized sample gas and ejection of the ions from the ion trap 115. The output impedance of the photodiode array 150 may closely match the ion trap. A DC bypass inductor 190 may be monolithically implemented to prevent DC bias on the trap. Varying the RF frequency or voltage can selectively destabilize ions and cause ejection through the aperture 160. The ejected ions can then be collected and measured by a low-current amplifier (such as an electron multiplier, not shown) and suitable signal processing methods for further applications. Since, the mass spectrometer 100 typically has small capacitance and power consumption, the photodiode array 150 need a small area compared to the ion trap mass spectrometer size.

FIGS. 3-7 illustrate the photodiode array a process for fabricating the photo diode array 150, in accordance with an embodiment. As shown in FIGS. 3-6, process steps 303, 304, 305 and 306 indicate general processing steps that can be followed to configure the resulting photo diode array 150. The photo diode array 150 can be configured in accordance with various known fabrication processes. The array 150, however, can be constructed on a commercially available silicon-on-insulator (SOI) wafer 330. Such an SOI wafer may include a single-crystal base and, for example, approximately 2 microns of thermally grown silicon oxide between the base and approximately 73 microns of single-crystal silicon overlying the silicon oxide. Although the SOI wafer 330 can be configured according to a standard wafer bonding process, it can be understood that such an SOI wafer 330 is discussed herein for general illustrative and exemplary purposes only, and can be configured according to other fabrication processes or in association with other layer types or thicknesses.

Figure 3:
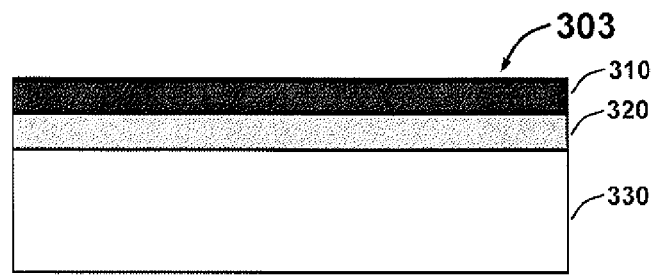
FIGS. 3-6 illustrate a fabrication process of the monolithic photodiode array, in accordance with the disclosed embodiments.

A p-n junction, for example, can be initially formed on the SOI (Silicon on Insulator) substrate 330 utilizing an implant or epitaxial technique, as depicted in the process step 303 of FIG. 3. The p-n junction is a junction formed at the interface of the P-type and N-type semiconductors 310 and 320. The epitaxial technique described herein refers to a method of depositing a monocrystalline film on a monocrystalline substrate. The deposited film can be denoted an as epitaxial film or epitaxial layer (e.g. p-n junction 310, 320). Note that depending upon the design considerations the electrode 125 can be configured from the N-type semiconductor material 320 as disclosed herein.

Figure 4:
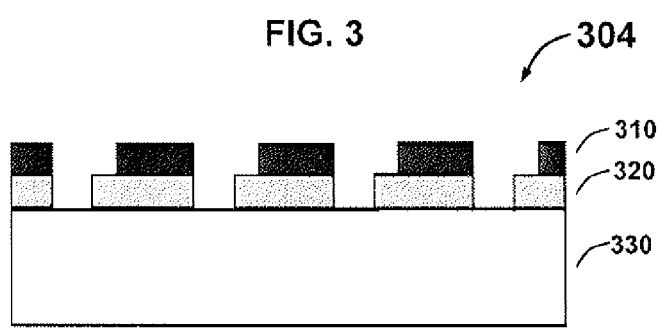

The p-n junction layer 310 and 320 can be etched, as illustrated in FIG. 4. The p-n junction layer 310 and 320 can be preferably etched utilizing standard silicon etching procedures, such as, for example, a DRIE (Deep Reactive Ion Etch) process, or another appropriate processing technique. Preferably, a standard photolithography process can be utilized to define the desired structural shapes in the SOI wafer 330. Examples of suitable shapes include, but are not limited to, cantilevered beams, suspended beams, combs, tuning forks, plates, etc.

Figure 5:
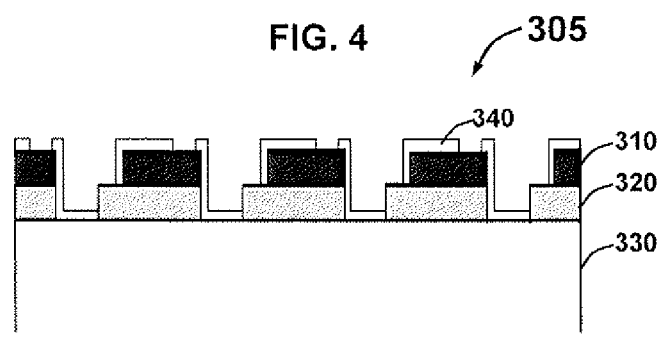
Figure 6:
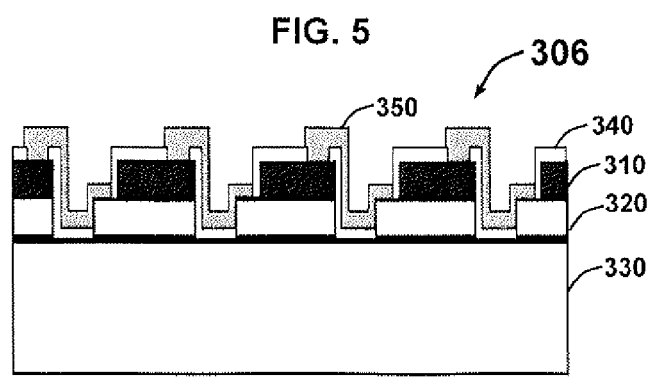

Next, as indicated by the processing step 305 depicted in FIG. 5, a dielectric layer 340 can be formed on the etched substrate. The dielectric layer 340 is an electric insulator in order to resist the flow of electric current. The electrodes 120 and 125 can be separated by the electrical insulation layer 340 that prevents arcing between the two electrodes 120 and 125 at high voltage and frequency. The spacing of the end cap electrodes 120 and 125 and thickness of the insulation layer 340 can be adjusted to optimize the performance of the resulting photodiode array 150 The insulating material can withstand the high voltages required to create a potential well. An interconnect layer 350 can be formed above the insulation layer 340, as depicted by the processing step 306 shown in FIG. 6.

Figure 7:
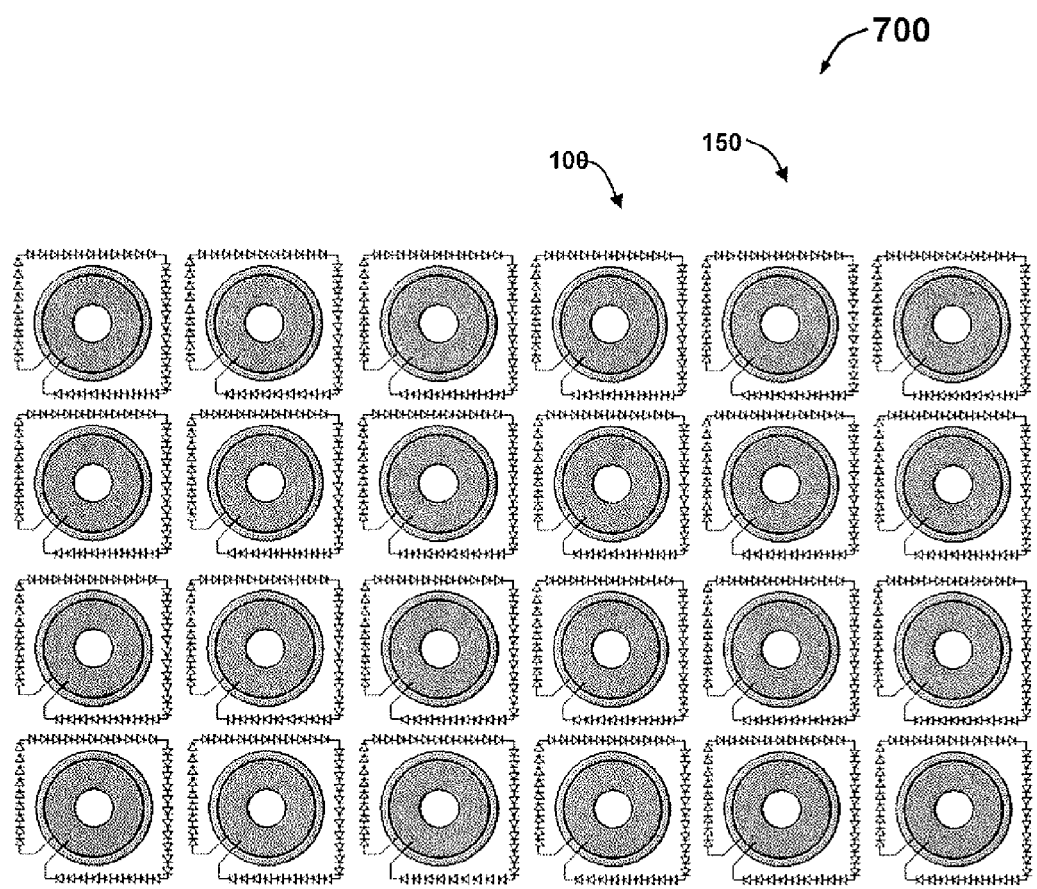
FIG. 7 illustrates a front view of the spectrometer array of FIGS. 3-6, in accordance with the disclosed embodiments.

The photodiode array 150 can be monolithically fabricated to the individual ion trap mass spectrometer 100 in order to form the ion trap mass spectrometer array 700, as depicted in FIG. 7. Various micro fabrication techniques, such as lithography, deep reactive ion etching (DRIE), reactive ion etching (RIE), low pressure chemical vapor deposition (LPCVD) and plasma enhanced chemical vapor deposition (PECVD), etc., can be utilized for fabricating the ion trap mass spectrometer array 700 depending upon design considerations. These techniques can be characterized and employed for fabricating structures with precise dimension control and excellent uniformity.

Figure 8:
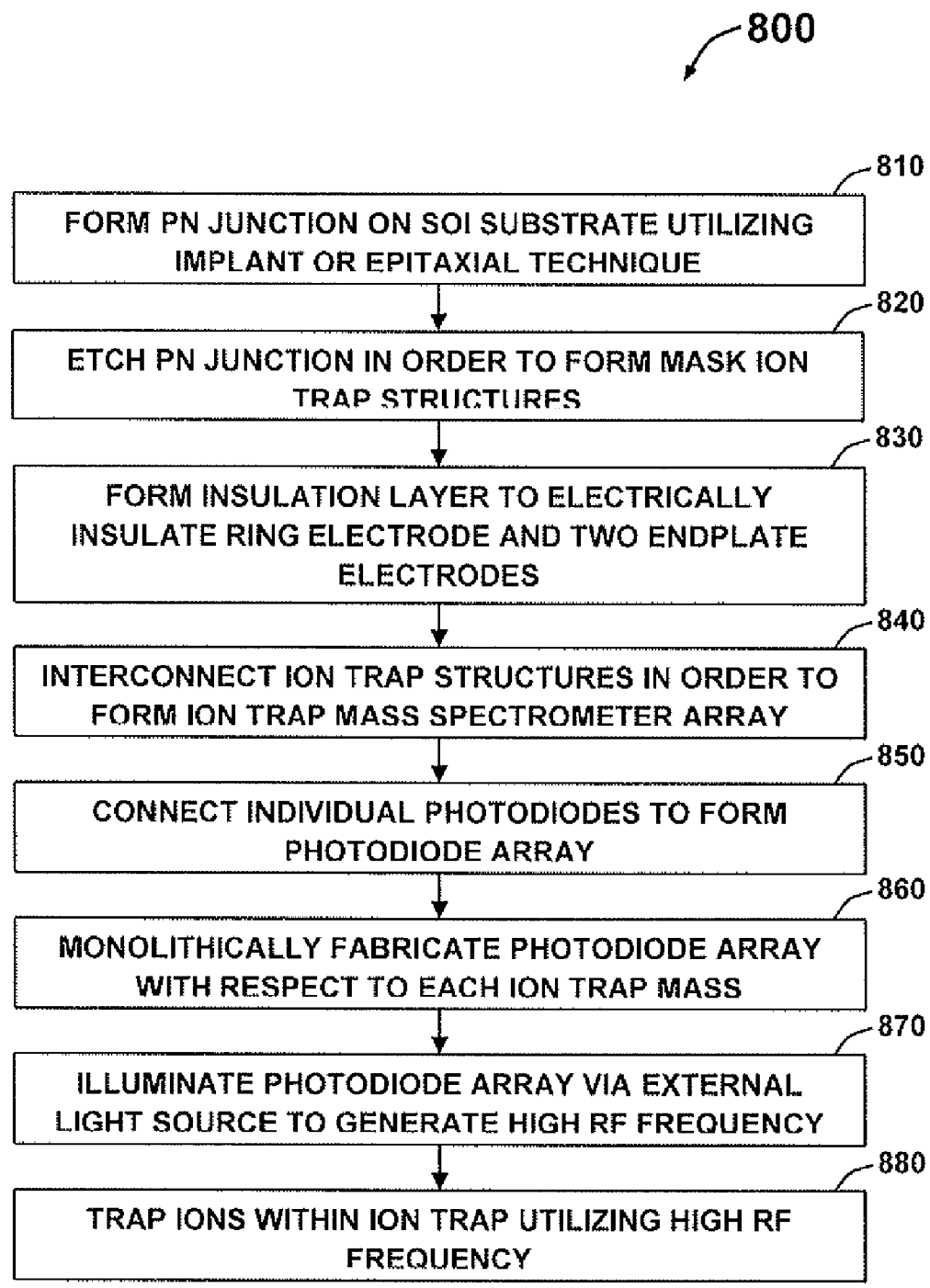
FIG. 8 illustrates a flow chart of operation illustrating logical operational steps of a method for fabricating a mass spectrometer in association with a monolithic photodiode array, in accordance with the disclosed embodiments.

FIG. 8 illustrates a flow chart of operation illustrating logical operational steps of a method 800 for fabricating the ion trap mass spectrometer 100 driven by the monolithic photodiode array 150, in accordance with the disclosed embodiments. Again as reminder, in FIGS. 1-8, identical or similar parts are generally indicated by identical reference numerals. The p-n junction 310 and 320 can be formed on the SOI substrate 330 via the implant or epitaxial technique, as illustrated at block 810. The p-n junction 310 and 320 can be etched in order to mask ion traps structures associated with the ion trap mass spectrometer array 700, as depicted at block 820. The insulation layer 340 can be formed to electrically insulate the ring electrode 130 and two endplate electrodes 120 and 125, as depicted at block 830.

The ion traps structures can be interconnected to form the ion trap mass spectrometer array structure 700, as illustrated at block 840. Thereafter, the individual photodiode 150 can be connected to form the photodiode array 150, as depicted at block 850. The photodiode array 150 can be monolithically fabricated in association with each ion trap mass spectrometer 100, as indicated at block 860. Next, as illustrated at block 870, the photodiode array 150 can be illuminated via the external light source 110 in order to generate on site high RF frequency 105. The ions can be therefore trapped within the ion trap 115 utilizing the high RF frequency, as depicted at block 880.

The photodiode array 150 enables high voltage modulation at 10-1000 MHz and the high output impedance closely matches the ion trap. Such an approach 800 can be utilized to fabricate a miniature or a micro scale ITMS structure as an individual and/or an array device. The mass spectrometer array 700 can be utilized for the chemical analysis of known and unknown compounds due to its ability to effectively analyze large as well as small molecules. The mass spectrometer array 700 can further be utilized for applications such as portable or mobile gas detection, chemical and biological analysis, environmental monitoring, protein synthesis and DNA sequencing and so forth.

Based on the foregoing, it can be appreciated that in an embodiment, an ion trap mass spectrometer system can include a mass spectrometer that provides mass spectroscopy at a high operating pressure. The mass spectrometer can be configured to include a cylindrical electrode and two or more end cap electrodes separated by an insulation layer. In such an embodiment, a photovoltaic voltage source can be located in proximity to the mass spectrometer, the photovoltaic voltage source comprising a photodiode array to generate an alternating voltage at a radio frequency for trapping ions in a trapping volume defined by the cylindrical ring electrode and the planar end cap electrodes.

In another embodiment of such a system a light source can be provided for illuminating the photodiode array to generate the alternating voltage at radio frequency across the photodiode array. The light source can be modulated at a desired radio frequency to attain a radio frequency voltage modulation. In some embodiments of such a system, the photodiode array can include a plurality of serially connected photodiodes. In other embodiments, the photodiode array can be monolithically fabricated in association with the mass spectrometer. In another embodiment, the mass spectrometer in association the photodiode array can be fabricated to form an array with respect to the mass spectrometer structure. In still a further embodiment of such a system, the mass spectrometer structure can generate an on-site radio frequency to eliminate transmission loss. Additionally, the cylindrical ring electrode and the planar end cap electrodes can be electrically connected via an inductor, such as the by-pass inductor 190 indicated earlier.

It can be further appreciated that an embodiment is disclosed of a method for configuring the disclosed ion trap mass spectrometer system. Such a method can include, for example, configuring a mass spectrometer that provides mass spectroscopy at a high operating pressure, arranging the mass spectrometer to include a cylindrical electrode and two or more end cap electrodes separated by an insulation layer, locating a photovoltaic voltage source in proximity to the mass spectrometer, and modifying the photovoltaic voltage source to include a photodiode array to generate an alternating voltage at a radio frequency for trapping ions in a trapping volume defined by the cylindrical ring electrode and the planar end cap electrodes.

In another embodiment of such a method, operations can be performed including providing a light source for illuminating the photodiode array to generate the alternating voltage at radio frequency across the photodiode array, modulating the light source at a desired radio frequency to attain a radio frequency voltage modulation, and electrically connecting the cylindrical ring electrode and the planar end cap electrodes via an inductor. Other processing steps include, but are not limited to, for example, configuring the photodiode array to include a plurality of serially connected photodiodes.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An ion trap mass spectrometer system, comprising:
   a mass spectrometer that provides mass spectroscopy at a high operating pressure, said mass spectrometer including a cylindrical electrode and at least two end cap electrodes separated by an insulation layer; and a photovoltaic voltage source located in proximity to said mass spectrometer, said photovoltaic voltage source comprising a photodiode array to generate an alternating voltage at a radio frequency for trapping ions in a trapping volume defined by said cylindrical ring electrode and said at least two planar end cap electrodes.

2. The system of claim 1 further comprising a light source for illuminating said photodiode array to generate said alternating voltage at radio frequency across said photodiode array.

3. The system of claim 1 wherein said light source is modulated at a desired radio frequency to attain a radio frequency voltage modulation.

4. The system of claim 1 wherein said photodiode array comprises a plurality of serially connected photodiodes.

5. The system of claim 1 wherein said photodiode array is monolithically fabricated in association with said mass spectrometer.

6. The system of claim 1 wherein said mass spectrometer in association said photodiode array is fabricated to form an array with respect to said mass spectrometer structure.

7. The system of claim 1 wherein said mass spectrometer structure generates an on-site radio frequency to eliminate a transmission loss.

8. The system of claim 1 wherein said cylindrical ring electrode and said planar end cap electrodes are electrically connected via an inductor.

9. An ion trap mass spectrometer system, comprising:
a mass spectrometer that provides mass spectroscopy at a high operating pressure, said mass spectrometer including a cylindrical electrode and at least two end cap electrodes separated by an insulation layer;
a photovoltaic voltage source located in proximity to said mass spectrometer, said photovoltaic voltage source comprising a photodiode array to generate an alternating voltage at a radio frequency for trapping ions in a trapping volume defined by said cylindrical ring electrode and said at least two planar end cap electrodes; and
a light source for illuminating said photodiode array to generate said alternating voltage at radio frequency across said photodiode array.

10. The system of claim 9 wherein said light source is modulated at a desired radio frequency to attain a radio frequency voltage modulation.

11. The system of claim 9 wherein said photodiode array comprises a plurality of serially connected photodiodes.

12. The system of claim 9 wherein said photodiode array is monolithically fabricated in association with said mass spectrometer.

13. The system of claim 9 wherein said mass spectrometer in association said photodiode array is fabricated to form an array with respect to said mass spectrometer structure.

14. The system of claim 9 wherein said mass spectrometer structure generates an on-site radio frequency to eliminate a transmission loss.

15. The system of claim 9 wherein said cylindrical ring electrode and said planar end cap electrodes are electrically connected via an inductor.

16. A method for configuring an ion trap mass spectrometer system, said method comprising:
configuring a mass spectrometer that provides mass spectroscopy at a high operating pressure;
arranging said mass spectrometer to include a cylindrical electrode and at least two end cap electrodes separated by an insulation layer;
locating a photovoltaic voltage source in proximity to said mass spectrometer; and
modifying said photovoltaic voltage source to include a photodiode array to generate an alternating voltage at a radio frequency for trapping ions in a trapping volume defined by said cylindrical ring electrode and said at least two planar end cap electrodes.

17. The method of claim 16 further comprising providing a light source for illuminating said photodiode array to generate said alternating voltage at radio frequency across said photodiode array.

18. The method of claim 16 further comprising modulating said light source at a desired radio frequency to attain a radio frequency voltage modulation.

19. The method of claim 16 electrically connecting said cylindrical ring electrode and said planar end cap electrodes via an inductor.

20. The method of claim 16 further comprising configuring said photodiode array to include a plurality of serially connected photodiodes.

21. An ion trap mass spectrometer system, comprising:
a ion trap array that provides mass spectroscopy at a operating pressure higher than conventional ITMS, said ion trap array including a cylindrical ring electrode and at least two planar end cap electrodes separated by an insulation layer; and
a photovoltaic source located in proximity to said ion trap array, said photovoltaic source comprising a photodiode array to generate a high radio frequency voltage for trapping ions in a trapping volume defined by said cylindrical ring electrode and said at least two planar end cap electrodes.

22. The system of claim 21 further comprising light source for illuminating said photodiode array to generate said high radio frequency voltage across said photodiode array.

23. The system of claim 21 wherein said light source is modulated at a desired radio frequency to attain a radio frequency voltage modulation.

24. The system of claim 21 wherein said photodiode array comprises a plurality of connected photodiodes.

25. The system of claim 21 wherein said photodiode array is monolithically fabricated in association with said ion trap array.

26. The system of claim 21 wherein said ion trap array in association said photodiode array is fabricated to form an array with respect to said ion trap array structure.

27. The system of claim 21 wherein said light source and photodiode array structure generates an on-site high voltage radio frequency ion trap driving signals which eliminates driving signal transmission loss.

* * * * *